(12) United States Patent
Gao

(10) Patent No.: US 11,476,861 B2
(45) Date of Patent: Oct. 18, 2022

(54) ERROR CORRECTION METHOD AND TIME-INTERLEAVED ANALOG-TO-DIGITAL CONVERTER

(71) Applicant: HUAWEI TECHNOLOGIES CO., LTD., Guangdong (CN)

(72) Inventor: Fang Gao, Shanghai (CN)

(73) Assignee: Huawei Technologies Co., Ltd., Guangdong (CN)

( * ) Notice: Subject to any disclaimer, the term of this patent is extended or adjusted under 35 U.S.C. 154(b) by 0 days.

(21) Appl. No.: 17/319,899

(22) Filed: May 13, 2021

(65) Prior Publication Data

US 2021/0266002 A1 Aug. 26, 2021

Related U.S. Application Data

(63) Continuation of application No. PCT/CN2018/116039, filed on Nov. 16, 2018.

(51) Int. Cl.
  *H03M 1/06* (2006.01)
  *H03M 1/08* (2006.01)
  *H03M 1/12* (2006.01)

(52) U.S. Cl.
  CPC ....... *H03M 1/0697* (2013.01); *H03M 1/0607* (2013.01); *H03M 1/0624* (2013.01); *H03M 1/0836* (2013.01); *H03M 1/1215* (2013.01)

(58) Field of Classification Search
  CPC ............. H03M 1/0697; H03M 1/0624; H03M 1/0836; H03M 1/0607; H03M 1/1215
  (Continued)

(56) References Cited

U.S. PATENT DOCUMENTS 6,121,799 A * 9/2000 Moser ................ G06J 1/00
                                                342/45
8,487,805 B1   7/2013 Gupta et al.
(Continued)

FOREIGN PATENT DOCUMENTS

CN   1503455 A   6/2004
CN   103036671 A   4/2013
(Continued)

OTHER PUBLICATIONS

Extended European Search Report issued in European Application No. 18939896.9 dated Oct. 5, 2021, 12 pages.
(Continued)

*Primary Examiner* — Khai M Nguyen
(74) *Attorney, Agent, or Firm* — Fish & Richardson P.C.

(57) ABSTRACT

An error correction method and a time-interleaved analog-to-digital converter (TIADC) are provided. The method is applied to a TIADC that includes a plurality of analog-to-digital converters (ADCs), and the method includes: determining whether a current value of a codeword of a first ADC in the plurality of ADCs is within a preset range; when the current value of the codeword of the first ADC is not within the preset range, adjusting a plurality of codewords that are in a one-to-one correspondence with the plurality of ADCs; and controlling a clock frequency division circuit to generate, by using a plurality of adjusted codewords, a plurality of sampling clocks that are in a one-to-one correspondence with the plurality of ADCs. In embodiments of this application, a sampling time-period skew existing between ADCs may be adjusted by adjusting codewords corresponding to the ADCs.

20 Claims, 4 Drawing Sheets

(58) Field of Classification Search
USPC .......................................... 341/118, 120, 155
See application file for complete search history.

(56) References Cited

U.S. PATENT DOCUMENTS

| 9,030,341 B2* | 5/2015 | Tan ..................... H03M 1/1052 |
| | | 341/120 |
| 2010/0164763 A1 | 7/2010 | Kidambi |
| 2011/0063149 A1 | 3/2011 | Kidambi |

FOREIGN PATENT DOCUMENTS

| CN | 103312329 A | 9/2013 |
| CN | 103888141 A | 6/2014 |
| CN | 105262487 A | 1/2016 |

OTHER PUBLICATIONS

PCT International Search Report and Written Opinion in International Application No. PCT/CN2018/116039, dated Jun. 11, 2019, 15 pages.

* cited by examiner

ERROR CORRECTION METHOD AND TIME-INTERLEAVED ANALOG-TO-DIGITAL CONVERTER

CROSS-REFERENCE TO RELATED APPLICATIONS

This application is a continuation of International Application No. PCT/CN2018/116039, filed on Nov. 16, 2018, the disclosure of which is hereby incorporated by reference in its entirety.

TECHNICAL FIELD

Embodiments of this application relate to the field of electronic circuit technologies, and in particular, to an error correction method and a time-interleaved analog-to-digital converter.

BACKGROUND

In a time-interleaved analog-to-digital converter (TIADC), a plurality of parallel analog-to-digital converters (ADC) performs sampling in a time interleaved manner. However, because analog circuits cannot be completely consistent, various types of mismatches exist between ADCs. For example, a sampling time period mismatch, that is, a skew between sampling time periods of two adjacent ADCs deviates from an ideal time skew. Consequently, a sampled waveform is distorted, so that clutter is generated on a spectrum and a spurious free dynamic range (SFDR) severely deteriorates. Therefore, how to adjust a sampling time-period skew existing between ADCs becomes a technical problem to be urgently resolved, to ensure that a skew between sampling time periods of the ADCs is close to an ideal skew.

SUMMARY

Embodiments of this application disclose an error correction method and a TIADC, to adjust a sampling time-period skew existing between ADCs by adjusting codewords corresponding to the ADCs.

According to a first aspect, an error correction method is disclosed. The error correction method is applied to a TIADC that includes a plurality of ADCs, and the method includes: determining whether a current value of a codeword of a first ADC in the plurality of ADCs is within a preset range; when the current value of the codeword of the first ADC is not within the preset range, adjusting a plurality of codewords that are in a one-to-one correspondence with the plurality of ADCs; and controlling a clock frequency division circuit to generate, by using a plurality of adjusted codewords, a plurality of sampling clocks that are in a one-to-one correspondence with the plurality of ADCs. It can be seen that, when a current value of a codeword of an ADC is not in the preset range, a sampling time-period skew existing between ADCs may be adjusted by adjusting codewords that are in a one-to-one correspondence to all ADCs.

In an embodiment, an adjustment value may be first determined based on current values of the plurality of codewords and the preset range, and then the current values of the plurality of codewords are adjusted based on the adjustment value. In this way, after the codewords corresponding to the plurality of ADCs are adjusted, it can be ensured that the value of the codeword of the first ADC is within the preset range.

In an embodiment, a half of a difference between a codeword range and a sum of a maximum value and a minimum value of the plurality of codewords may be determined as the adjustment value. The codeword range is a difference between a maximum value and a minimum value of the preset range.

In an embodiment, a difference between a maximum value of the plurality of codewords and an upper boundary of the preset range may be determined as the adjustment value.

In an embodiment, a difference between a minimum value of the plurality of codewords and a lower boundary of the preset range may be determined as the adjustment value.

In an embodiment, differences between the current values of the plurality of codewords and the adjustment value may be used as respective values of the plurality of adjusted codewords.

In an embodiment, a difference between a maximum value of the plurality of codewords and a lower boundary of the preset range may be determined as the adjustment value.

In an embodiment, a difference between a minimum value of the plurality of codewords and an upper boundary of the preset range may be determined as the adjustment value.

In an embodiment, sums of the current values of the plurality of codewords and the adjustment value may be used as respective values of the plurality of adjusted codewords.

In an embodiment, a skew between a sampling time period of the first ADC and a sampling time period of a second ADC may be first obtained, and it is determined whether the skew converges. When the skew does not converge, it is determined whether the current value of the codeword of the first ADC is within the preset range. This can avoid an unnecessary processing process, thereby improving efficiency of adjusting the sampling time-period skew existing between ADCs. The second ADC is a reference ADC in the plurality of ADCs.

In an embodiment, when the current value of the codeword of the first ADC is within the preset range, a codeword corresponding to the first ADC is adjusted based on a preset step, and an adjusted codeword corresponding to the first ADC is used to control the clock frequency division circuit to generate a sampling clock corresponding to the first ADC. In this way, when the current value of the codeword of the first ADC is within the preset range, the sampling time-period skew existing between ADCs can be adjusted by adjusting the codeword corresponding to the first ADC.

In an embodiment, the preset range may be a range of a sampling time-period skew that is allowed to exist between the plurality of ADCs in an analog domain.

In an embodiment, the clock frequency division circuit may be an analog phase-locked loop (PLL).

A second aspect discloses a TIADC, including a plurality of ADCs, an error estimation circuit, and a clock frequency division circuit. The error estimation circuit is configured to: determine whether a current value of a codeword of a first ADC in the plurality of ADCs is within a preset range, when the current value of the codeword of the first ADC is not within the preset range, adjust a plurality of codewords that are in a one-to-one correspondence with the plurality of ADCs, and send a plurality of adjusted codewords to the clock frequency division circuit. The clock frequency division circuit is configured to generate, by using the plurality of adjusted codewords, a plurality of sampling clocks that are in a one-to-one correspondence with the plurality of ADCs. It can be seen that, when a current value of a codeword of an ADC is not in the preset range, a sampling time-period skew existing between ADCs may be adjusted by adjusting codewords that are in a one-to-one correspondence to all ADCs.

In an embodiment, the error estimation circuit may first determine an adjustment value based on current values of the plurality of codewords and the preset range, and then adjust the current values of the plurality of codewords based on the adjustment value. In this way, after the codewords corresponding to the plurality of ADCs are adjusted, it can be ensured that the value of the codeword of the first ADC is within the preset range.

In an embodiment, the error estimation circuit may determine a half of a difference between a codeword range and a sum of a maximum value and a minimum value of the plurality of codewords as the adjustment value. The codeword range is a difference between a maximum value and a minimum value of the preset range.

In an embodiment, the error estimation circuit may determine a difference between a maximum value of the plurality of codewords and an upper boundary of the preset range as the adjustment value.

In an embodiment, the error estimation circuit may determine a difference between a minimum value of the plurality of codewords and a lower boundary of the preset range as the adjustment value.

In an embodiment, the error estimation circuit may use differences between the current values of the plurality of codewords and the adjustment value as respective values of the plurality of adjusted codewords.

In an embodiment, the error estimation circuit may determine a difference between a maximum value of the plurality of codewords and a lower boundary of the preset range as the adjustment value.

In an embodiment, the error estimation circuit may determine a difference between a minimum value of the plurality of codewords and an upper boundary of the preset range as the adjustment value.

In an embodiment, the error estimation circuit may use sums of the current values of the plurality of codewords and the adjustment value as respective values of the plurality of adjusted codewords.

In an embodiment, the error estimation circuit is further configured to: obtain a skew between a sampling time period of the first ADC and a sampling time period of a second ADC, determine whether the skew converges, and when the skew does not converge, determine whether the current value of the codeword of the first ADC is within the preset range. This can avoid an unnecessary processing process, thereby improving efficiency of adjusting the sampling time-period skew existing between ADCs. The second ADC is a reference ADC in the plurality of ADCs.

In an embodiment, the error estimation circuit is further configured to: when the current value of the codeword of the first ADC is within the preset range, adjust, based on a preset step, a codeword corresponding to the first ADC, and send an adjusted codeword of the first ADC to the clock frequency division circuit. The clock frequency division circuit is further configured to generate, by using the adjusted codeword corresponding to the first ADC, a sampling clock corresponding to the first ADC. In this way, when the current value of the codeword of the first ADC is within the preset range, the clock frequency division circuit can adjust the sampling time-period skew existing between ADCs by adjusting the codeword corresponding to the first ADC.

In an embodiment, the preset range may be a range of a sampling time-period skew that is allowed to exist between the plurality of ADCs in an analog domain.

In an embodiment, the clock frequency division circuit may be an analog PLL.

DESCRIPTION OF EMBODIMENTS

Embodiments of this application disclose an error correction method and a TIADC, to adjust a sampling time-period skew existing between ADCs by adjusting codewords corresponding to the ADCs. Detailed descriptions are provided below.

Figure 1:
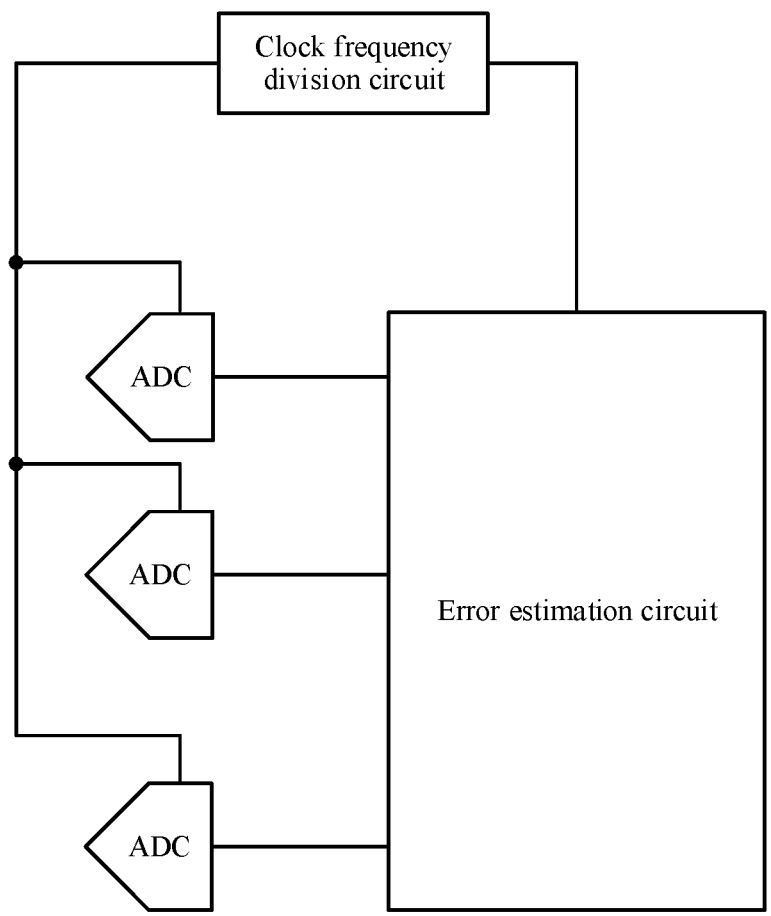
FIG. 1 is a schematic structural diagram of a TIADC disclosed according to an embodiment of this application.

FIG. 1 is a schematic structural diagram of a TIADC disclosed according to an embodiment of this application. As shown in FIG. 1, the TIADC may include a plurality of ADCs, an error estimation circuit, and a clock frequency division circuit.

The error estimation circuit is configured to: determine whether a current value of a codeword of a first ADC in the plurality of ADCs is within a preset range, when the current value of the codeword of the first ADC is not within the preset range, adjust a plurality of codewords that are in a one-to-one correspondence with the plurality of ADCs, and send a plurality of adjusted codewords to the clock frequency division circuit.

The clock frequency division circuit is configured to generate, by using the plurality of adjusted codewords, a plurality of sampling clocks that are in a one-to-one correspondence with the plurality of ADCs.

In this embodiment, an output end of the clock frequency division circuit is coupled to clock input ends of the plurality of ADCs, and the error estimation circuit is coupled to the plurality of ADCs and the clock frequency division circuit. Two circuits, two components, or a circuit and a component are coupled, that is, there is a connection relationship between the two circuits, between the two components, or between the circuit and the component. In addition, another component or circuit may be connected between the two circuits, between the two components, or between the circuit and the component, or another component or circuit may not be connected between the two circuits, between the two components, or between the circuit and the component. Coupling between the error estimation circuit and the clock frequency division circuit may be single-channel coupling or multi-channel coupling. When a skew between sampling time periods of ADCs in the TIADC is to be corrected, any one of the plurality of ADCs may be selected as a reference ADC, other ADCs are ADCs that need to be corrected, and an ADC that is being corrected may be referred to as a corrected ADC. The first ADC may be referred to as the corrected ADC.

In a possible implementation, that the error estimation circuit adjusts a plurality of codewords that are in a one-to-one correspondence with the plurality of ADCs may include:

The error estimation circuit determines an adjustment value based on current values of the plurality of codewords and the preset range; and the error estimation circuit adjusts the current values of the plurality of codewords based on the adjustment value.

In a possible implementation, that the error estimation circuit determines an adjustment value based on current values of the plurality of codewords and the preset range may include:

The error estimation circuit determines a half of a difference between a codeword range and a sum of a maximum value and a minimum value of the plurality of codewords as the adjustment value. The codeword range is a difference between a maximum value and a minimum value of the preset range.

In a possible implementation, that the error estimation circuit determines an adjustment value based on current values of the plurality of codewords and the preset range may include:

The error estimation circuit determines a difference between a maximum value of the plurality of codewords and an upper boundary of the preset range as the adjustment value.

In a possible implementation, that the error estimation circuit determines an adjustment value based on current values of the plurality of codewords and the preset range may include:

The error estimation circuit determines a difference between a minimum value of the plurality of codewords and a lower boundary of the preset range as the adjustment value.

In a possible implementation, that the error estimation circuit adjusts the current values of the plurality of codewords based on the adjustment value includes:

The error estimation circuit uses differences between the current values of the plurality of codewords and the adjustment value as respective values of the plurality of adjusted codewords.

In a possible implementation, that the error estimation circuit determines an adjustment value based on current values of the plurality of codewords and the preset range includes:

The error estimation circuit determines a difference between a maximum value of the plurality of codewords and a lower boundary of the preset range as the adjustment value.

In a possible implementation, that the error estimation circuit determines an adjustment value based on current values of the plurality of codewords and the preset range includes:

The error estimation circuit determines a difference between a minimum value of the plurality of codewords and an upper boundary of the preset range as the adjustment value.

In a possible implementation, that the error estimation circuit adjusts the current values of the plurality of codewords based on the adjustment value may include:

The error estimation circuit uses sums of the adjustment value and the current values of the plurality of codewords as respective values of the plurality of adjusted codewords.

In a possible implementation, the error estimation circuit is further configured to: obtain a skew between a sampling time period of the first ADC and a sampling time period of a second ADC, determine whether the skew converges, and when the skew does not converge, determine whether the current value of the codeword of the first ADC is within the preset range. The second ADC is a reference ADC in the plurality of ADCs.

In a possible implementation, the error estimation circuit is further configured to: when the current value of the codeword of the first ADC is within the preset range, adjust, based on a preset step, a codeword corresponding to the first ADC, and send an adjusted codeword corresponding to the first ADC to the clock frequency division circuit.

The clock frequency division circuit is further configured to generate, by using the adjusted codeword corresponding to the first ADC, a sampling clock corresponding to the first ADC.

In a possible implementation, the preset range is a range of a sampling time-period skew that is allowed to exist between the plurality of ADCs in an analog domain.

In a possible implementation, the clock frequency division circuit may be an analog PLL.

Figure 2:
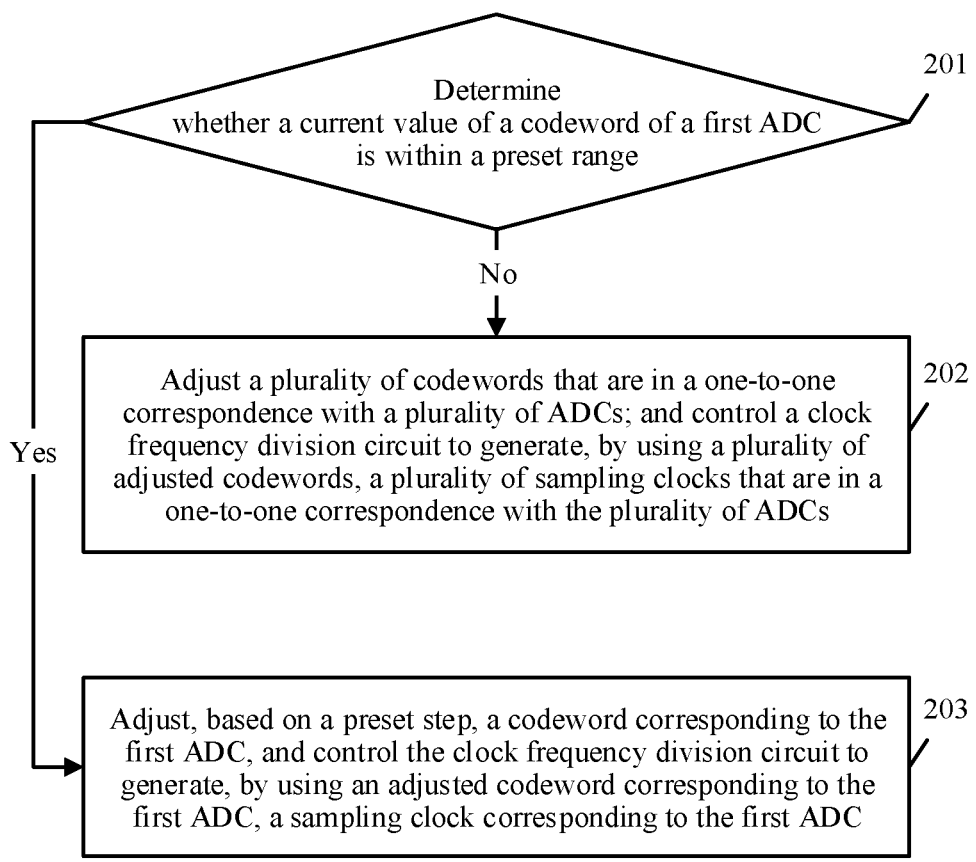
FIG. 2 is a schematic flowchart of an error correction method disclosed according to an embodiment of this application.

FIG. 2 is a schematic flowchart of an error correction method disclosed according to an embodiment of this application. The error correction method is applied to the TIADC shown in FIG. 1. As shown in FIG. 2, the error correction method may include the following steps.

201: Determine whether a current value of a codeword of a first ADC is within a preset range. When the current value of the codeword of the first ADC is not within the preset range, perform step 202; and when the current value of the codeword of the first ADC is within the preset range, perform step 203.

In this embodiment, when a sampling time-period skew existing between ADCs needs to be corrected, it may be determined whether the current value of the codeword of the first ADC in a plurality of ADCs is within the preset range. The current value of the codeword of the first ADC may be first obtained, and then it is determined whether the current value of the codeword of the first ADC is within the preset range. A boundary value may be included or may not be included in the preset range. The first ADC may be any ADC that is in the plurality of ADCs included in a TIADC and that needs to be corrected. The preset range is a range of sampling time-period skews that are allowed to exist between the ADCs in an analog domain.

202: Adjust a plurality of codewords that are in a one-to-one correspondence with the plurality of ADCs; and control a clock frequency division circuit to generate, by using a plurality of adjusted codewords, a plurality of sampling clocks that are in a one-to-one correspondence with the plurality of ADCs.

In this embodiment, when it is determined that the current value of the codeword of the first ADC is not within the preset range, the plurality of codewords that are in the one-to-one correspondence with the plurality of ADCs may be first adjusted, and then the clock frequency division circuit is controlled to generate, by using the plurality of adjusted codewords, the plurality of sampling clocks that are in the one-to-one correspondence with the plurality of ADCs. In this way, an adjusted value of the codeword of the first ADC is within the preset range. An adjustment value may be first determined based on current values of the plurality of codewords and the preset range, and the current values of the plurality of codewords are adjusted based on the adjustment value.

Figure 3:
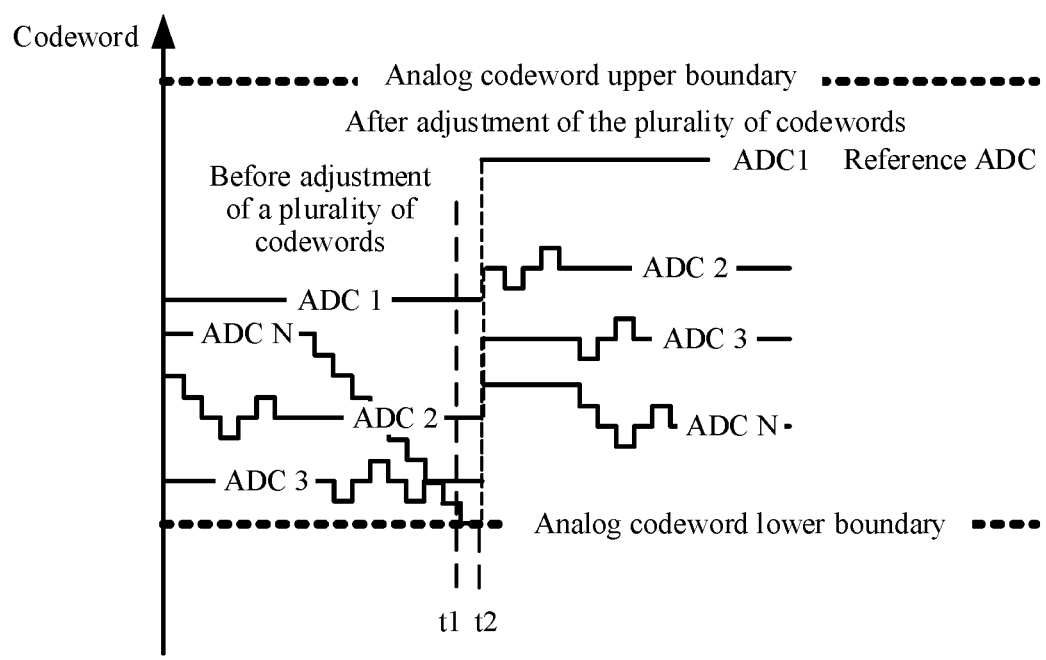
FIG. 3 is a schematic diagram of adjustment that is of a codeword corresponding to an ADC and that is disclosed according to an embodiment of this application.

In this embodiment, a half of a difference between a codeword range and a sum of a maximum value and a minimum value of the plurality of codewords may be determined as the adjustment value. Alternatively, a difference between a maximum value of the plurality of codewords and an upper boundary of the preset range may be determined as the adjustment value. Alternatively, a difference between a minimum value of the plurality of codewords and a lower boundary of the preset range may be determined as the adjustment value. The codeword range is a difference between a maximum value and a minimum value in the preset range. A codeword corresponding to an ADC is an array including registers in the ADC. A value of the codeword corresponding to the ADC may be a binary value of the array including the registers in the ADC, may be a decimal value of the array including the registers in the ADC, or may be another numerical value of the array including the registers in the ADC. This is not limited in this embodiment. After the adjustment value is determined, differences between the current values of the plurality of codewords and the adjustment value may be directly used as respective values of the plurality of adjusted codewords, and then step 201 is performed again. FIG. 3 is a schematic diagram of adjustment that is of a codeword corresponding to an ADC and that is disclosed according to an embodiment of this application. It is assumed that a preset range in FIG. 3 is (0, 128), where 0 is a lower boundary, and 128 is an upper boundary. An ADC 1 is a reference ADC, and a value of a codeword of the ADC 1 may be constantly 64 and is a maximum value of values of codewords of all ADCs. It can be seen that, a codeword of an ADC N is always in a decreasing trend. At a time point t1, a value of the codeword of the ADC N is 0. If the value is not adjusted, the value is to exceed the preset range. Therefore, based on the solution of this application, a half of a difference between a codeword range and a sum of a maximum value and a minimum value of the codewords of the plurality of ADCs may be used as an adjustment value $\Delta$, namely, $\Delta=((64+0)-128)/2=-32$. The adjustment value is subtracted from a value of a codeword of each ADC at the time point t1, to obtain a value of the codeword of each ADC at a time point t2. It can be learned that, at the time point t2, the value of the codeword of the ADC 1 is $64-(-32)=96$, and the value of the codeword of the ADC N is $0-(-32)=32$. Codeword adjustment of another ADC is similar to codeword adjustment of the ADC 1 and the ADC N, and details are not described herein. Alternatively, a difference between a maximum value of a plurality of codewords and the upper boundary of the preset range may be determined as an adjustment value $\Delta$, namely, $\Delta=64-128=-64$. The adjustment value is subtracted from a value of a codeword of each ADC at the time point t1, to obtain a value of the codeword of each ADC at a time point t2. It can be learned that, at the time point t2, the value of the codeword of the ADC 1 is $64-(-64)=128$, and the value of the codeword of the ADC N is $0-(-64)=64$. Codeword adjustment of another ADC is similar to codeword adjustment of the ADC 1 and the ADC N, and details are not described herein.

In this embodiment, alternatively, a difference between a maximum value of a plurality of codewords and the lower boundary of the preset range may be determined as an adjustment value. Alternatively, a difference between a minimum value of a plurality of codewords and the upper boundary of the preset range may be determined as an adjustment value. After the adjustment value is determined, sums of the adjustment value and the current values of the plurality of codewords may be directly used as respective values of the plurality of adjusted codewords, and then step 201 is performed again. It is assumed that a preset range in FIG. 3 is (0, 128), where 0 is a lower boundary, and 128 is an upper boundary. An ADC 1 is a reference ADC, and a value of a codeword of the ADC 1 may be constantly 64 and is a maximum value in values of codewords of all ADCs. It can be seen that, a codeword of an ADC N is always in a decreasing trend. At a time point t1, a value of the codeword of the ADC N is 0. If the value is not adjusted, the value is to exceed the preset range. Therefore, based on the solution of this application, a difference between a maximum value of the plurality of codewords and the lower boundary of the preset range may be determined as an adjustment value $\Delta$, namely, $\Delta=64-0=64$. The adjustment value is added to a value of a codeword of each ADC at the time point t1, to obtain a value of the codeword of each ADC at a time point t2. It can be learned that, at the time point t2, the value of the codeword of the ADC 1 is $64+64=128$, and the value of the codeword of the ADC N is $0+64=64$. Codeword adjustment of another ADC is similar to codeword adjustment of the ADC 1 and the ADC N, and details are not described herein.

203: Adjust, based on a preset step, a codeword corresponding to the first ADC, and control the clock frequency division circuit to generate, by using an adjusted codeword corresponding to the first ADC, a sampling clock corresponding to the first ADC.

In this embodiment, when it is determined that the current value of the codeword of the first ADC is within the preset range, the codeword corresponding to the first ADC may be first adjusted based on the preset step, and then the clock frequency division circuit is controlled to generate, by using the adjusted codeword corresponding to the first ADC, the sampling clock corresponding to the first ADC. When the codeword corresponding to the first ADC is adjusted for a first time in a current correction period, because it is unknown to adjust, to which direction, the codeword corresponding to the first ADC to reduce a derivation between a sampling time period of the first ADC and a sampling time period of a second ADC, adjustment may be performed in any direction. To be specific, a positive value may be added, or a negative value may be added. When the codeword corresponding to the first ADC is adjusted for a second time in the current correction period, it may be first determined whether a second skew between the sampling time period of the first ADC and the sampling time period of the second ADC is less than the first skew. When it is determined that the second skew is less than the first skew, codeword adjustment continues to be performed in an original direction. When it is determined that the second skew is greater than the first skew, codeword adjustment is performed in an opposite direction. Adjustment for the codeword corresponding to the first ADC may be performed based on the preset step. The preset step is a minimum value of adjustable codewords. An absolute value of each adjustment may be a preset step, or may be an integer multiple of the preset step. For example, when a difference between a skew and an ideal skew is relatively large, the adjustment value may be relatively large; when a difference between a skew and an ideal skew is relatively small, the adjustment value may be relatively small.

Figure 4:
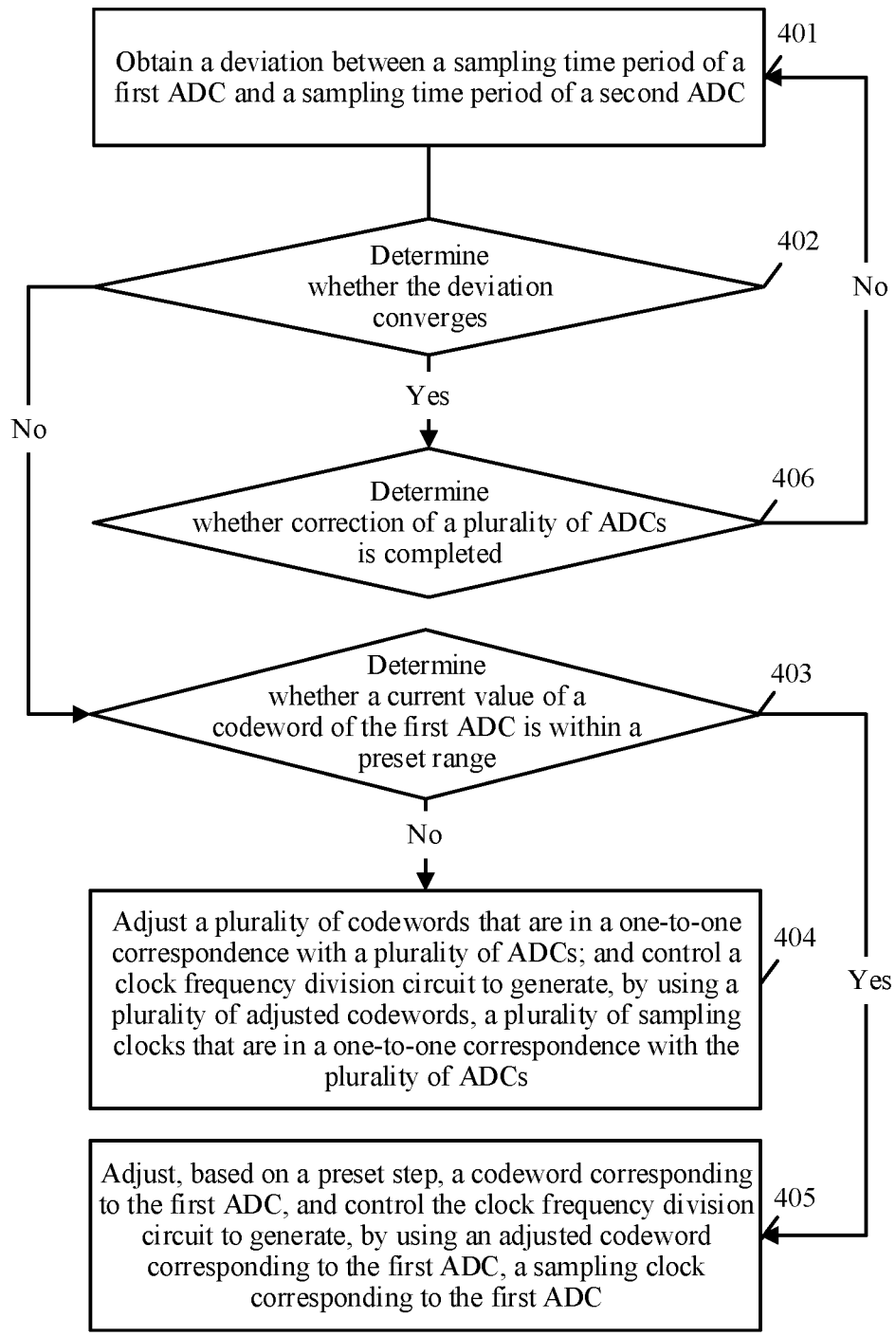
FIG. 4 is a schematic flowchart of another error correction method disclosed according to an embodiment of this application.

FIG. 4 is a schematic flowchart of another error correction method disclosed according to an embodiment of this application. The error correction method is applied to the TIADC shown in FIG. 1. As shown in FIG. 4, the error correction method may include the following steps.

401: Obtain a skew between a sampling time period of a first ADC and a sampling time period of a second ADC.

In this embodiment, when a sampling time-period skew existing between ADCs needs to be corrected, the skew between the sampling time period of the first ADC and the sampling time period of the second ADC may be obtained.

A sampling clock of the first ADC and a sampling clock of the second ADC may be first obtained, and then the skew between the sampling time period of the first ADC and the sampling time period of the second ADC is determined based on the sampling clock of the first ADC and the sampling clock of the second ADC. Alternatively, the skew between the sampling time period of the first ADC and the sampling time period of the second ADC may be obtained in another manner. This is not limited in this embodiment. The sampling clock of the first ADC and the sampling clock of the second ADC may be obtained by monitoring a working time period of the first ADC and a working time period of the second ADC, or may be obtained in another manner. This is not limited in this embodiment. The first ADC is any ADC that is in a plurality of ADCs included in a TIADC and that needs to be corrected, and the second ADC is a reference ADC in the plurality of ADCs included in the TIADC.

402: Determine whether the skew converges; and when the skew does not converge, perform step 403, or when the skew converges, perform step 406.

In this embodiment, after the skew between the sampling time period of the first ADC and the sampling time period of the second ADC is obtained, it may be first determined whether the skew converges. When it is determined that the skew does not converge, step 403 is performed. When it is determined that the skew converges, step 406 is performed. Whether the skew converges may be determined based on the skew and N skews. The N skews are skews that are between the sampling time period of the first ADC and the sampling time period of the second ADC and that are adjacent to the skew, and N is an integer greater than 1. Therefore, after the skew between the sampling time period of the first ADC and the sampling time period of the second ADC is obtained for a first time and a second time in a current correction period, step 402 does not need to be performed, but step 403 is directly performed. After the skew between the sampling time period of the first ADC and the sampling time period of the second ADC is obtained for a third time and a time after the third time in the current correction period, whether the skew converges needs to be first determined based on the skew and the N skews. To be specific, it is determined whether the N+1 skews fluctuate around a value and a fluctuation range is less than a threshold. When it is determined that the N+1 skews fluctuate around a value and a fluctuation range is less than a threshold, it is determined that the skew converges. When it is determined that the N+1 skews do not fluctuate around a value or a fluctuation range is greater than or equal to a threshold, it is determined that the skew does not converge.

403: Determine whether a current value of a codeword of the first ADC is within a preset range; when the current value of the codeword of the first ADC is not within the preset range, perform step 404; and when the current value of the codeword of the first ADC is within the preset range, perform step 405.

In this embodiment, when it is determined that the skew does not converge, the current value of the codeword of the first ADC may be first obtained, and then it is determined whether the current value of the codeword of the first ADC is within the preset range. A boundary value may be included or may not be included in the preset range. The preset range is a range of a sampling time-period skew that is allowed to exist between the ADCs in an analog domain.

404: Adjust a plurality of codewords that are in a one-to-one correspondence with the plurality of ADCs; and control a clock frequency division circuit to generate, by using a plurality of adjusted codewords, a plurality of sampling clocks that are in a one-to-one correspondence with the plurality of ADCs.

In this embodiment, when it is determined that the current value of the codeword of the first ADC is not within the preset range, the plurality of codewords that are in the one-to-one correspondence with the plurality of ADCs may be first adjusted, and then the clock frequency division circuit is controlled to generate, by using the plurality of adjusted codewords, the plurality of sampling clocks that are in the one-to-one correspondence with the plurality of ADCs. In this way, an adjusted value of the codeword of the first ADC is within the preset range. An adjustment value may be first determined based on current values of the plurality of codewords and the preset range, and the current values of the plurality of codewords are adjusted based on the adjustment value.

In this embodiment, a half of a difference between a codeword range and a sum of a maximum value and a minimum value of the plurality of codewords may be determined as the adjustment value. Alternatively, a difference between a maximum value of the plurality of codewords and an upper boundary of the preset range may be determined as the adjustment value. Alternatively, a difference between a minimum value of the plurality of codewords and a lower boundary of the preset range may be determined as the adjustment value. The codeword range is a difference between a maximum value and a minimum value of the preset range. A codeword corresponding to an ADC is an array including registers in the ADC. A value of the codeword corresponding to the ADC may be a binary value of the array including the registers in the ADC, may be a decimal value of the array including the registers in the ADC, or may be another numerical value of the array including the registers in the ADC. This is not limited in this embodiment. After the adjustment value is determined, differences between the current values of the plurality of codewords and the adjustment value may be directly used as respective values of the plurality of adjusted codewords, and then step 201 is performed again. FIG. 3 is a schematic diagram of codeword adjustment disclosed according to an embodiment of this application. It is assumed that a preset range in FIG. 3 is (0, 128), where 0 is a lower boundary, and 128 is an upper boundary. An ADC 1 is a reference ADC, and a value of a codeword of the ADC 1 may be constantly 64 and is a maximum value of values of codewords of all ADCs. It can be seen that, a codeword of an ADC N is always in a decreasing trend. At a time point t1, a value of the codeword of the ADC N is 0. If the value is not adjusted, the value is to exceed the preset range. Therefore, based on the solution of this application, a half of a difference between a codeword range and a sum of a maximum value and a minimum value of the codewords of the plurality of ADCs may be used as an adjustment value $\Delta$, namely, $\Delta=((64+0)-128)/2=-32$. The adjustment value is subtracted from a value of a codeword of each ADC at the time point t1, to obtain a value of the codeword of each ADC at a time point t2. It can be seen that, at the time point t2, the value of the codeword of the ADC 1 is 64−(−32)=96, and the value of the codeword of the ADC N is 0−(−32)=32. Codeword adjustment of another ADC is similar to codeword adjustment of the ADC 1 and the ADC N, and details are not described herein. Alternatively, a difference between a maximum value of a plurality of codewords and the upper boundary of the preset range may be determined as an adjustment value $\Delta$, namely, $\Delta=64-128=-64$. The adjustment value is subtracted from a value of a codeword of each ADC at the time point t1, to obtain a value of the codeword of each ADC at a time point t2. It can be seen that, at the time point t2, the value of the codeword of the ADC 1 is 64−(−64)=128, and the value of the codeword of the ADC N is 0−(−64)=64. Codeword adjustment of another ADC is similar to codeword adjustment of the ADC 1 and the ADC N, and details are not described herein.

In this embodiment, alternatively, a difference between a maximum value of a plurality of codewords and the lower boundary of the preset range may be determined as an adjustment value. Alternatively, a difference between a minimum value of a plurality of codewords and the upper boundary of the preset range may be determined as an adjustment value. After the adjustment value is determined, sums of the adjustment value and the current values of the plurality of codewords may be directly used as respective values of the plurality of adjusted codewords, and then step 201 is performed again. It is assumed that a preset range in FIG. 3 is (0, 128), where 0 is a lower boundary, and 128 is an upper boundary. An ADC 1 is a reference ADC, and a value of a codeword of the ADC 1 may be constantly 64 and is a maximum value of values of codewords of all ADCs. It can be seen that, a codeword of an ADC N is always in a decreasing trend. At a time point t1, a value of the codeword of the ADC N is 0. If the value is not adjusted, the value is to exceed the preset range. Therefore, based on the solution of this application, a difference between a maximum value of the plurality of codewords and the lower boundary of the preset range may be determined as an adjustment value $\Delta$, namely, $\Delta=64-0=64$. The adjustment value is added to a value of a codeword of each ADC at the time point t1, to obtain a value of the codeword of each ADC at a time point t2. It can be seen that, at the time point t2, the value of the codeword of the ADC 1 is 64+64=128, and the value of the codeword of the ADC N is 0+64=64. Codeword adjustment of another ADC is similar to codeword adjustment of the ADC 1 and the ADC N, and details are not described herein.

405: Adjust, based on a preset step, a codeword corresponding to the first ADC, and control the clock frequency division circuit to generate, by using an adjusted codeword corresponding to the first ADC, a sampling clock corresponding to the first ADC.

In this embodiment, when it is determined that the current value of the codeword of the first ADC is within the preset range, the codeword corresponding to the first ADC may be first adjusted based on the preset step, and then the clock frequency division circuit is controlled to generate, by using the adjusted codeword corresponding to the first ADC, the sampling clock corresponding to the first ADC. When the codeword corresponding to the first ADC is adjusted for a first time in a current correction period, because it is unknown to adjust, to which direction, the codeword corresponding to the first ADC to reduce a derivation between the sampling time period of the first ADC and the sampling time period of the second ADC, adjustment may be performed in any direction. To be specific, a positive value may be added, or a negative value may be added. When the codeword corresponding to the first ADC is adjusted for a second time in the current correction period, it may be first determined whether a second skew between the sampling time period of the first ADC and the sampling time period of the second ADC is less than the first skew. When it is determined that the second skew is less than the first skew, codeword adjustment continues to be performed in an original direction. When it is determined that the second skew is greater than the first skew, codeword adjustment is performed in an opposite direction. Adjustment for the codeword corresponding to the first ADC may be performed based on the preset step. The preset step is a minimum value of adjustable codewords. An absolute value of each adjustment may be a preset step, or may be an integer multiple of the preset step. For example, when a difference between a skew and an ideal skew is relatively large, the adjustment value may be relatively large; and when a difference between a skew and an ideal skew is relatively small, the adjustment value may be relatively small.

406: Determine whether correction of the plurality of ADCs is completed, and if the correction of the plurality of ADCs is not completed, perform step 401.

In this embodiment, when it is determined that the skew converges, it is further determined whether the correction of the plurality of ADCs is completed, that is, it is determined whether correction of all ADCs is completed in the current correction period. When it is determined that the correction of the plurality of ADCs is completed, it indicates that the current correction period is completed, and the current correction period ends. When it is determined that the correction of the plurality of ADCs is not completed, it indicates that the current correction period is not completed, and any ADC in ADCs that have not been corrected may be determined as the second ADC, and step 401 is performed.

The objectives, technical solutions, and benefits of this application are further described in detail in the foregoing specific embodiments. It should be understood that the foregoing descriptions are merely specific embodiments of this application, but are not intended to limit the protection scope of this application. Any modification, equivalent replacement, or improvement made based on the technical solutions of this application shall fall within the protection scope of this application.

What is claimed is:

1. An error correction method, applied to a time-interleaved analog-to-digital converter (TIADC) comprising a plurality of analog-to-digital converters (ADCs), wherein the method comprises:
   determining whether a current value of a codeword of a first ADC in the plurality of ADCs is within a preset range;
   when the current value of the codeword of the first ADC is not within the preset range, adjusting a plurality of codewords that are in a one-to-one correspondence with the plurality of ADCs; and
   controlling a clock frequency division circuit to generate, by using a plurality of adjusted codewords, a plurality of sampling clocks that are in the one-to-one correspondence with the plurality of ADCs.

2. The method according to claim 1, wherein the adjusting a plurality of codewords that are in a one-to-one correspondence with the plurality of ADCs comprises:
   determining an adjustment value based on current values of the plurality of codewords and the preset range; and
   adjusting the current values of the plurality of codewords based on the adjustment value.

3. The method according to claim 2, wherein the determining an adjustment value based on current values of the plurality of codewords and the preset range comprises:
   determining a half of a difference between a codeword range and a sum of a maximum value and a minimum value of the plurality of codewords as the adjustment value, wherein the codeword range is a difference between a maximum value and a minimum value of the preset range.

4. The method according to claim 2, wherein the determining an adjustment value based on current values of the plurality of codewords and the preset range comprises:
determining a difference between a maximum value of the plurality of codewords and an upper boundary of the preset range as the adjustment value.

5. The method according to claim 2, wherein the determining an adjustment value based on current values of the plurality of codewords and the preset range comprises:
determining a difference between a minimum value of the plurality of codewords and a lower boundary of the preset range as the adjustment value.

6. The method according to claim 2, wherein the adjusting the current values of the plurality of codewords based on the adjustment value comprises:
using differences between the adjustment value and the current values of the plurality of codewords as respective values of the plurality of adjusted codewords.

7. The method according to claim 2, wherein the determining an adjustment value based on current values of the plurality of codewords and the preset range comprises:
determining a difference between a maximum value of the plurality of codewords and a lower boundary of the preset range as the adjustment value.

8. The method according to claim 2, wherein the determining an adjustment value based on current values of the plurality of codewords and the preset range comprises:
determining a difference between a minimum value of the plurality of codewords and an upper boundary of the preset range as the adjustment value.

9. The method according to claim 7, wherein the adjusting the current values of the plurality of codewords based on the adjustment value comprises:
using sums of the adjustment value and the current values of the plurality of codewords as respective values of the plurality of adjusted codewords.

10. The method according to claim 1, wherein the method further comprises:
obtaining a skew between a sampling time period of the first ADC and a sampling time period of a second ADC, wherein the second ADC is a reference ADC in the plurality of ADCs;
determining whether the skew converges; and
when the skew does not converge, performing step of determining whether the current value of the codeword of the first ADC in the plurality of ADCs is within the preset range.

11. The method according to claim 1, wherein the method further comprises:
when the current value of the codeword of the first ADC is within the preset range, adjusting, based on a preset step, a codeword corresponding to the first ADC; and
controlling the clock frequency division circuit to generate, by using an adjusted codeword corresponding to the first ADC, a sampling clock corresponding to the first ADC.

12. The method according to claim 1, wherein the preset range is a range of a sampling time-period skew that is allowed to exist between the plurality of ADCs in an analog domain.

13. The method according to claim 1, wherein the clock frequency division circuit is an analog phase-locked loop PLL.

14. A time-interleaved analog-to-digital converter (TIADC), comprising a plurality of ADCs, an error estimation circuit, and a clock frequency division circuit, wherein the error estimation circuit is configured to:
determine whether a current value of a codeword of a first ADC in the plurality of ADCs is within a preset range;
when the current value of the codeword of the first ADC is not within the preset range, adjust a plurality of codewords that are in a one-to-one correspondence with the plurality of ADCs, and;
send a plurality of adjusted codewords to the clock frequency division circuit; and
the clock frequency division circuit is configured to:
generate, by using the plurality of adjusted codewords, a plurality of sampling clocks that are in the one-to-one correspondence with the plurality of ADCs.

15. The TIADC according to claim 14, wherein the error estimation circuit is configured to:
determine an adjustment value based on current values of the plurality of codewords and the preset range; and
adjust the current values of the plurality of codewords based on the adjustment value.

16. The TIADC according to claim 15, wherein the error estimation circuit is configured to:
determine a half of a difference between a codeword range and a sum of a maximum value and a minimum value of the plurality of codewords as the adjustment value, wherein the codeword range is a difference between a maximum value and a minimum value of the preset range.

17. The TIADC according to claim 15, wherein the error estimation circuit is configured to:
determine a difference between a maximum value of the plurality of codewords and an upper boundary of the preset range as the adjustment value.

18. The TIADC according to claim 15, wherein the error estimation circuit is configured to:
determine a difference between a minimum value of the plurality of codewords and a lower boundary of the preset range as the adjustment value.

19. The TIADC according to claim 15, wherein the error estimation circuit is configured to:
use differences between the adjustment value and the current values of the plurality of codewords as respective values of the plurality of adjusted codewords.

20. The TIADC according to claim 14, wherein the error estimation circuit is further configured to:
when the current value of the codeword of the first ADC is within the preset range, adjust, based on a preset step, a codeword corresponding to the first ADC; and
the clock frequency division circuit is further configured to:
generate, by using an adjusted codeword corresponding to the first ADC, a sampling clock corresponding to the first ADC.

* * * * *